US010620284B2

(12) United States Patent
Paul et al.

(10) Patent No.: US 10,620,284 B2
(45) Date of Patent: Apr. 14, 2020

(54) METHOD AND APPARATUS DETERMINING A FAT CONTENT OF A LIVER OF A PATIENT USING MEASURED SPECTRAL MAGNETIC RESONANCE DATA

(71) Applicant: Siemens Healthcare GmbH, Erlangen (DE)

(72) Inventors: Dominik Paul, Bubenreuth (DE); Ralf Kartaeusch, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 92 days.

(21) Appl. No.: 15/891,835

(22) Filed: Feb. 8, 2018

(65) Prior Publication Data
US 2018/0231627 A1 Aug. 16, 2018

(30) Foreign Application Priority Data
Feb. 10, 2017 (DE) .................. 10 2017 202 161

(51) Int. Cl.
| | |
|---|---|
| *G01V 3/00* | (2006.01) |
| *G01R 33/48* | (2006.01) |
| *G01R 33/56* | (2006.01) |
| *G01R 33/485* | (2006.01) |

(52) U.S. Cl.
CPC ........ *G01R 33/4828* (2013.01); *G01R 33/485* (2013.01); *G01R 33/5608* (2013.01)

(58) Field of Classification Search
CPC ............. G01R 33/543; G01R 33/5659; G01R 33/3415; G01R 33/36; A61B 5/055
USPC ....................................................... 324/309
See application file for complete search history.

(56) References Cited

U.S. PATENT DOCUMENTS

| | | | | |
|---|---|---|---|---|
| 4,902,973 A | * | 2/1990 | Keren ................ | G01R 33/4828 324/307 |
| 2009/0276187 A1 | * | 11/2009 | Martin .................. | G01N 24/08 702/189 |
| 2012/0081695 A1 | * | 4/2012 | Majumdar ............ | G01J 3/0221 356/72 |
| 2015/0323449 A1 | * | 11/2015 | Jones ................. | G01N 21/3103 356/437 |

(Continued)

OTHER PUBLICATIONS

Pineda et. al.: "Measurement of Hepatic Lipid: High-Speed T2-Corrected Multiecho Acquisition at IH MR Spectroscopy—A Rapid and Accurate Technique";: Radiology; vol. 252, No. 2; pp. 568-576; (2009).

*Primary Examiner* — Walter L Lindsay, Jr.
(74) *Attorney, Agent, or Firm* — Schiff Hardin LLP

(57) ABSTRACT

In a method and apparatus for determining the fat content of the liver of a patient using measured spectral magnetic resonance data, wherein a first contribution to the spectral magnetic resonance data is based on fat, a second contribution to the spectral magnetic resonance data is based on water and on a further substance, a frequency range that forms the basis of the spectral magnetic resonance data is subdivided at least into a first subrange and into a second subrange, the second contribution is approximated using the spectral magnetic resonance data from the second subrange. The first contribution is determined taking into account the spectral magnetic resonance data and the approximation of the second contribution. The fat content is determined on the basis of the first contribution.

18 Claims, 4 Drawing Sheets

(56) References Cited

U.S. PATENT DOCUMENTS

2015/0331076 A1* 11/2015 Neji .................. G01R 33/4835
                                                               324/309

* cited by examiner

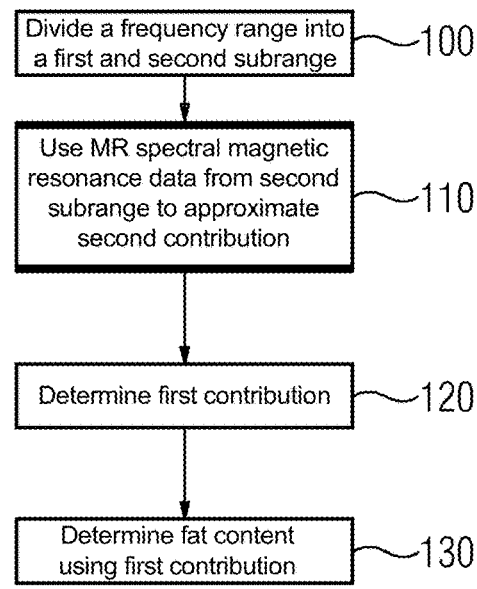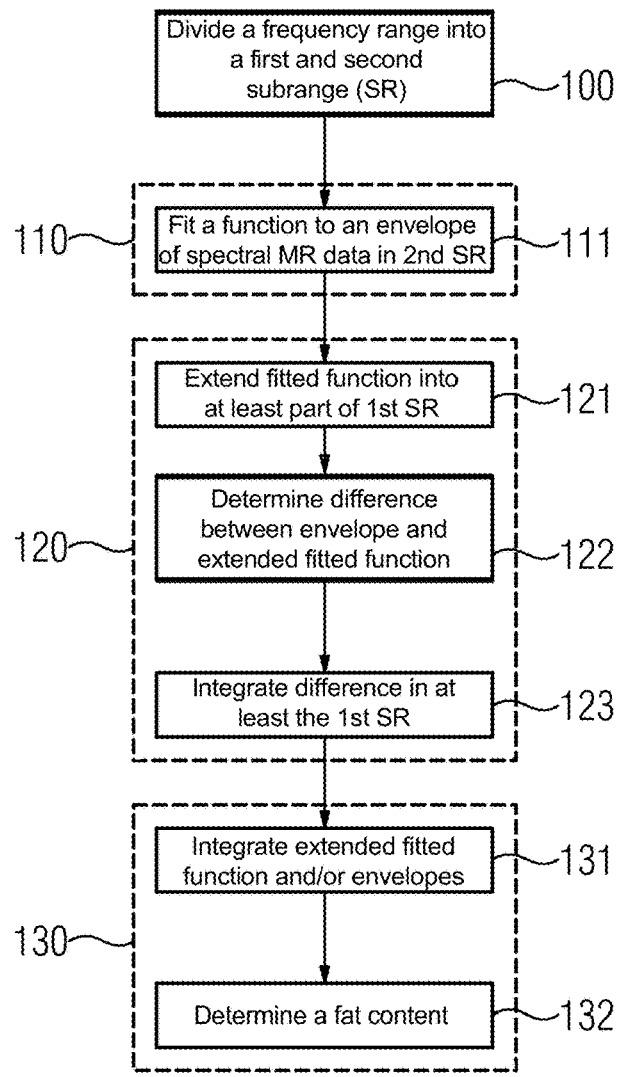

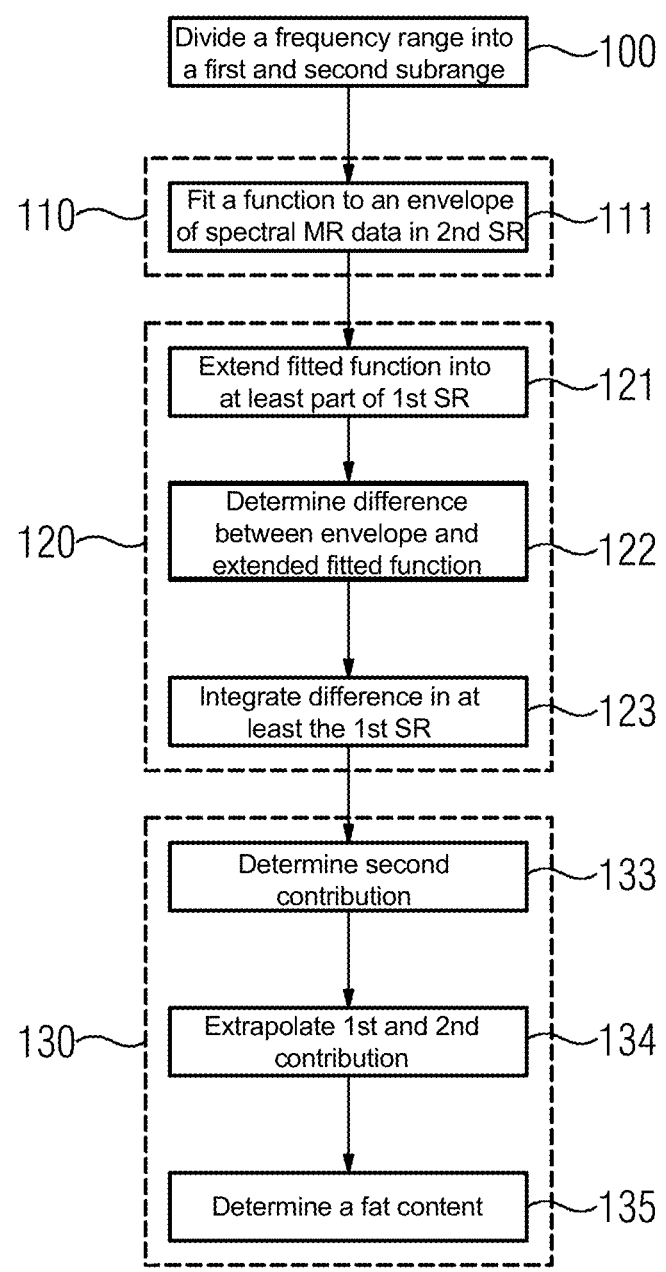

METHOD AND APPARATUS DETERMINING A FAT CONTENT OF A LIVER OF A PATIENT USING MEASURED SPECTRAL MAGNETIC RESONANCE DATA

BACKGROUND OF THE INVENTION

Field of the Invention

The invention concerns a method, a magnetic resonance apparatus, and an electronically readable data storage medium for determining a fat content of a liver of a patient using measured spectral magnetic resonance data.

Description of the Prior Art

In magnetic resonance examinations, a magnetic resonance apparatus is normally used to apply a relatively high basic magnetic field, for example of 1.5 or 3 or 7 tesla, to the examination object, in particular a patient. In addition, a gradient coil arrangement is used to apply switched gradient fields. Radio-frequency (RF) pulses, for instance excitation pulses, are then emitted by an RF antenna using suitable antenna coils, causing the nuclear spins of certain atoms, which spins have been excited to resonance by these RF pulses, to be tipped by a defined flip angle with respect to the magnetic field lines of the basic magnetic field. RF signals, known as magnetic resonance signals, are emitted when the nuclear spins relax. These signals are received by suitable RF antennas and then processed further. Magnetic resonance data are thereby acquired in a defined region of the subject under examination, which is examination region. Thus a specific magnetic resonance sequence must be emitted for a particular measurement, which is composed of a succession of RF pulses, for instance excitation pulses and refocusing pulses, and switched gradient fields, which must be emitted in a coordinated manner to fit the RF pulse sequence, on different gradient axes in different spatial directions. Readout windows, which are set at times to fit this sequence, define the time intervals in which the induced magnetic resonance signals, the magnetic resonance data, are acquired.

The magnetic resonance signals emitted by the nuclear spins typically have a number of frequencies within a frequency range, these frequencies depending on the environment of the nuclear spins. Typically, all the RF signals having frequencies within this frequency range, or a subrange thereof, are acquired in the acquisition of the magnetic resonance data. Spectral magnetic resonance data are characterized by the magnetic resonance signals being recorded with their corresponding frequencies. Spectral magnetic resonance data can be associated with a frequency at which the corresponding MR signals were emitted by the nuclear spins. On the basis of spectral magnetic resonance data, information can be extracted about the environment of the nuclear spins that have emitted the corresponding magnetic resonance signals. In particular, a chemical composition and/or a content of various tissues inside the examination region can be determined from spectral magnetic resonance data.

SUMMARY OF THE INVENTION

An object of the invention is to define a particularly simple and accurate method for determining a fat content of a liver of a patient using measured spectral magnetic resonance data.

In the method according to the invention for determining a fat content of a liver of a patient using measured spectral magnetic resonance data, magnetic resonance data are provided to a computer that have a first contribution to the spectral magnetic resonance data based on fat, and a second contribution to the spectral magnetic resonance data based on water and on a further substance, and the method has the following steps.

A frequency range that forms the basis of the spectral magnetic resonance data is subdivided in the computer at least into a first subrange and into a second subrange.

The second contribution is approximated in the computer using the spectral magnetic resonance data from the second subrange.

The first contribution is determined in the computer taking into account the spectral magnetic resonance data and the approximation of the second contribution.

The fat content is determined in the computer on the basis of the first contribution. An electronic signal corresponding to the fat content is generated in the computer, and is made available from the computer so the fat content can be stored or displayed for a user.

The method according to the invention is used in an examination of the liver of a patient, i.e. in the examination of a human being. The patient is thus the subject under examination in this context. The examination region, inside which the spectral magnetic resonance data were measured, thus includes the liver of the patient.

The first contribution to the spectral magnetic resonance data being based on fat means that the nuclear spins emitting magnetic resonance signals contributing to the first contribution are mainly surrounded by fat and/or are encompassed by fat molecules. The second contribution to the spectral magnetic resonance data being based on water and a further substance, means that the nuclear spins emitting magnetic resonance signals contributing to the second contribution are mainly surrounded and/or encompassed by water and/or the further substance.

Nuclear spins process approximately at a Larmor frequency determined by the nucleus associated with the nuclear spins and by the strength of the basic magnetic field. Nuclear spins have a frequency that differs from the Larmor frequency according to the environment of the nuclear spins, and which is specified typically as a fraction of the strength of the basic magnetic field and/or of the Larmor frequency. Thus the frequency of nuclear spins surrounded by fat typically exhibits a difference of between 0 ppm and 4 ppm from the Larmor frequency. The frequency of nuclear spins surrounded by water typically exhibits a difference of between 3 ppm and 8 ppm from the Larmor frequency. For spectral magnetic resonance data, the frequencies forming the basis of the magnetic resonance data are known. The liver has mainly nuclear spins respectively encompassed by water and fat. The liver may have at least one further substance that includes nuclear spins that contribute to the measured spectral magnetic resonance data. This further substance may be iron, for instance, which has accumulated in the liver of the patient.

Nuclear spins surrounded by the further substance typically have a frequency that differs from the Larmor frequency. Depending on the further substance, the difference of the frequency of the further substance from the Larmor frequency may lie, for example, at least in part in the region of the difference of the frequency of water. The second contribution to the spectral magnetic resonance data includes at least the magnetic resonance signals based on the at least one further substance and based on water.

Subdividing the frequency range forming the basis of the spectral magnetic resonance data can be done by a user of the magnetic resonance apparatus making an entry into the computer that specifies the subdivision, or can be done automatically by the computer. This process preferably takes into account a spectral distribution of the magnetic resonance data, which can be displayed to the user on a display monitor, for example, and/or can be provided to the computer. The subdivision preferably takes into account spectral characteristics of fat and/or water. These spectral characteristics can be ascertained and/or provided to the method according to the invention. For instance, the spectral characteristics can be a range for a typical difference of the frequency of nuclear spins surrounded by fat and/or water from the Larmor frequency.

The subdivision is preferably made such that, in a first subrange of the frequency range, magnetic resonance data based on magnetic resonance signals having a frequency within the first subrange mainly originate from nuclear spins surrounded by fat and/or encompassed by fat. The subdivision is preferably made such that, in a second subrange of the frequency range, spectral magnetic resonance data within the second subrange and based on fat preferably by an amount less than 30%, more preferably less than 20%, and particularly preferably less than 10%. The subdivision is preferably made such that, in the second subrange of the frequency range, magnetic resonance data based on magnetic resonance signals having a frequency within the second subrange mainly originate from nuclear spins surrounded by water and/or encompassed by water. The subdivision of the frequency range into the first subrange and into the second subrange preferably does not take into account the further substance.

The approximation of the second contribution preferably approximates the spectral magnetic resonance data within the frequency range that is based on water and optionally on the further substance. This approximation preferably usually takes into account primarily the spectral magnetic resonance data within the second subrange. The spectral magnetic resonance data within the frequency range are determined, which are based on water and/or the further substance, but are not based on fat.

The spectral magnetic resonance data and the approximation of the second contribution are used in determining the first contribution. In this process, the spectral magnetic resonance data within the frequency range are determined, which data are based on fat, are not based on water and/or the further substance. Magnetic resonance data lying outside the first subrange are preferably also taken into account. Magnetic resonance data lying inside the first subrange and based on water and/or the further substance are preferably also taken into account.

The fat content of the liver is a typical indicator of various diseases such as hepatic steatosis, for instance. The fat content can be determined, for example, from a component of the first contribution in the magnetic resonance signals emanating from the liver, i.e. from a component of the first contribution in the magnetic resonance data. The magnetic resonance data within the entire frequency range and/or the magnetic resonance data within the first subrange and the second subrange can be taken into account here.

An advantage of the method according to the invention is that the fat content of the liver can be determined particularly accurately and simply. The first contribution to the spectral magnetic resonance data can be determined accurately because account is taken of an effect of the further substance on the second contribution. An effect of the further substance that causes a broadening of the frequency range forming the basis of the second contribution can be included and taken into account in determining the first contribution and/or in determining the fat content. Approximating the second contribution makes it possible to include an effect of the further substance on the spectral magnetic resonance data based on water. The method according to the invention allows reliable determination of a fat content irrespective of the presence of a further substance and/or the concentration thereof. It is thereby possible to make a reliable diagnosis.

In an embodiment of the invention, a spread of the second contribution is determined in the approximation of the second contribution, and determining the first contribution takes into account the determined spread.

The approximation of the second contribution can involve fitting a curve, in particular fitting a function, to an envelope of the spectral magnetic resonance data within the second subrange. In this case, the curve or function preferably provide the best possible approximation of the envelope of the spectral magnetic resonance data in particular in the second subrange. On the basis of a Gaussian function, for example, parameters such as a mean value and/or a standard deviation can be defined such that the Gaussian function having the defined parameters differs as little as possible from the envelope of the spectral magnetic resonance data within the second subrange. The standard deviation of the defined function and/or curve, for example, can be used as the spread of said function and/or curve, and can be used as a measure of the spread of the second contribution.

The implementation of the further method steps can depend on a spread of the second contribution determined in this manner. For example, a limit value for the spread of the second contribution can be specified, and on the limit value being exceeded, the first contribution is determined in a manner that takes into account the fitted curve and/or function, in particular also an extension of the fitted curve and/or function into the first subrange. If the limit value is not reached, then determining the first contribution can take into account the approximation of the second contribution in a manner that takes account of the limit value not being reached. If the limit value is not reached, the first contribution can be determined taking into account the spectral magnetic resonance data within the first subrange, if applicable without taking into account the fitted curve and/or function.

An advantage of this embodiment is that a breadth of the frequency range associated with the spectral magnetic resonance data of the second contribution can be determined from the spread of the second contribution. This allows adaptability in the account taken of, for example, an intensity of an effect of the further substance on the second contribution in determining the first contribution. Depending on the strength of the effect of the further substance on the second contribution, the method according to the invention can proceed as a conventional method when a threshold value for the strength of the effect is not reached. If a threshold value is exceeded, the strength of the effect can be taken into account quantitatively on the basis of the approximated second contribution in determining the first contribution and/or in determining the fat content.

In an embodiment of the method, the approximation of the second contribution involves fitting a function to an envelope of the spectral magnetic resonance data within the second subrange.

If spectral magnetic resonance data is represented as a rate of occurrence of the spectral magnetic resonance data as a function of the corresponding frequency of this data, then the rate of occurrence can be depicted as a graph, which graph can be declared to be the envelope of the spectral magnetic resonance data.

As part of fitting a function, on the basis of a quantitative model, the envelope can be described by selecting, for example, at least one parameter of a predetermined function such that the deviation of the function having said parameter from the envelope is particularly small, preferably minimal, in the frequency range, in particular in the second subrange. A best-fit algorithm and/or approximation process can be used for this purpose, for example. In addition to the at least one parameter, it is also possible to select and/or provide the function and/or a quantitative model for describing the envelope. For instance, the function may be a Gaussian function and the parameters to be determined in an approximation process may be a mean value and/or a standard deviation of the Gaussian function.

Fitting a function is preferably performed on the basis of the spectral magnetic resonance data in the second subrange and/or originating from the second subrange. In this case, the envelope within the second subrange is preferably and/or mainly and/or solely taken into account for fitting the function.

An advantage of this embodiment is that the second contribution can be approximated particularly accurately. Proceeding from the spectral magnetic resonance data in the second subrange, a function can be defined and/or parameterized that may also be valid outside the second subrange and accordingly also approximates the second contribution outside the second subrange. The first contribution, based on a particularly accurately determined second contribution, and/or the fat content can hence be determined particularly accurately. Thus the fat content of a liver can be determined irrespective of a further substance such as iron, for example, and/or the reliability of a diagnosis based on the fat content of a liver can be increased.

In an embodiment of the method, the first contribution is determined by extending the fitted function into at least part of the first subrange, forming a difference between an envelope of the spectral magnetic resonance data and the extended fitted function, and determining the first contribution by integrating the difference in at least the first subrange.

According to this embodiment, a component of the second contribution in the first subrange is approximated for determining the first contribution. For this purpose, the fitted function is preferably expanded to at least part of the first subrange. The further substance typically produces an effect on the spectral magnetic resonance data, which effect causes smearing of the second contribution into the first subrange. This effect can be quantified using the portion of the fitted function that is expanded into the first subrange.

The envelope of the spectral magnetic resonance data typically indicates in the first subrange a greater rate of occurrence than the fitted function that has been extended into the first subrange. The outcome of forming the difference between the envelope of the spectral magnetic resonance data and the extended fitted function is preferably elimination of the second contribution, in particular the component of the second contribution based on the further substance, from the spectral magnetic resonance data in the first subrange. The difference is preferably formed in the entire frequency range. The rate of occurrence of the spectral magnetic resonance data produced by the first contribution can be determined by integrating the difference, in which process the first contribution to the spectral magnetic resonance data is eliminated particularly effectively. The difference is integrated typically at least in the first subrange. It is also possible to integrate the difference at least in part of the frequency range outside the first subrange or in the entire frequency range. This can result in a more accurate determination of the first contribution, because the forming of the difference also eliminates the second contribution outside the first subrange.

In an embodiment of the method, the fat content is determined by determining integrated data by integrating the extended fitted function and/or by integrating the envelopes of the spectral magnetic resonance data, and then forming a quotient from the first contribution and the integrated data.

An integration is performed preferably in the entire frequency range to determine integrated data. The integrated data hence include the rate of occurrence of the spectral magnetic resonance data produced by the first contribution and/or the rate of occurrence of the spectral magnetic resonance data within the particular subrange of the frequency range in which the integration was performed. Depending on the method selected for determining the integrated data, the quotient gives the component of the first contribution, in particular the fat content, relative to the component based on the second contribution and/or relative to the entire spectral magnetic resonance data. The fat content can be determined particularly accurately according to this embodiment.

In another embodiment of the method, the fat content is determined by determining the second contribution by integrating the extended fitted function, extrapolating the first contribution and extrapolating the second contribution in respect of an acquisition parameter, and forming a quotient from the extrapolated first contribution and the extrapolated second contribution.

According to this embodiment, the second contribution is not only approximated, but is determined by integrating the extended fitted function. The integration is performed in this case preferably within the entire frequency range.

The generation of magnetic resonance signals and the recording of magnetic resonance data, in particular spectral magnetic resonance data, is achieved by a magnetic resonance scanner being operated so as to emit magnetic resonance sequences. The various RF pulses and gradient pulses are selected and coordinated in this process according to acquisition parameters, which must be specified. If an acquisition parameter is altered, then, for instance, an intensity of magnetic resonance signals may change depending on their environment and/or depending on their position. The extrapolation preferably takes into account the effect of an altered acquisition parameter.

According to this embodiment, the first contribution is extrapolated preferably such that the extrapolated first contribution gives an approximation of the first contribution for at least one altered acquisition parameter. The second contribution is extrapolated preferably such that the extrapolated second contribution gives an approximation of the second contribution for the at least one altered acquisition parameter.

In spectroscopic imaging, a short echo time, in particular an echo time equal to zero, is typically desirable. It is typically not possible to record magnetic resonance data having an echo time equal to zero because of limitations of the magnetic resonance device, and therefore extrapolation in respect of the echo time, especially a particularly short echo time, is particularly advantageous.

In addition according to this embodiment, a quotient is formed in order to determine the fat content. In this case, the quotient preferably gives the ratio of the extrapolated first contribution with respect to the extrapolated second contribution and/or the ratio of the extrapolated first contribution with respect to the sum of the extrapolated first contribution and the extrapolated second contribution.

According to this embodiment, the effect of an acquisition parameter on the first contribution and/or on the second contribution and/or on the fat content can be eliminated and/or reduced. The fat content can hence be determined particularly accurately, so that the method is particularly robust and reliable.

In an embodiment of the method, the subdivision of the frequency range is made such that more than 80% of the first contribution to the spectral magnetic resonance data lies within the first subrange.

This is typically satisfied if a first subrange of the frequency range is selected for the first contribution that has a difference of at most 5 ppm, preferably of at most 4 ppm, particularly preferably of at most 3.5 ppm from the Larmor frequency. The first subrange of the frequency range is preferably selected such that it has a difference of between 0 ppm and 3.4 ppm from the Larmor frequency. The advantage of a first subrange selected in this manner is that the first contribution contributes less than 20% to the magnetic resonance data in the second subrange. If a function is fitted to the envelope of the spectral magnetic resonance data within the second subrange, then the first contribution has only a slight influence on the envelope and hence on the fitted function, and therefore the second contribution can be approximated particularly accurately. The fat content can hence be determined particularly accurately.

In an embodiment of the method, the subdivision of the frequency range is made such that more than 80% of a water-based contribution to the spectral magnetic resonance data lies within the second subrange.

This is typically satisfied if a first subrange of the frequency range is selected for the first contribution that has a difference of at most 10 ppm, preferably at most 9 ppm, particularly preferably at most 8 ppm from the Larmor frequency. The first subrange of the frequency range is preferably selected such that it has a difference of at least 1 ppm, preferably of at least 2 ppm, particularly preferably of at least 3 ppm from the Larmor frequency. The first subrange of the frequency range is preferably selected such that it has a difference of between 3.4 ppm and 8 ppm from the Larmor frequency. The advantage of a first subrange selected in this manner is that the second contribution contributes less than 20% to the magnetic resonance data in the first subrange. If a function is fitted to the envelope of the spectral magnetic resonance data within the second subrange, then the envelope and hence the fitted function are influenced by the second contribution by at least 80%, and therefore the second contribution can be approximated particularly accurately. The fat content can hence be determined particularly accurately.

In another embodiment of the method, the subdivision of the frequency range into the at least two subranges is made such that more than 80% of the spectral magnetic resonance data lies within the at least two subranges. The first subrange and the second subrange are preferably selected such that the first subrange and the second subrange are disjoint and/or contiguous. The method steps crucial to determining the fat content, for instance steps such as fitting the function and/or determining the first contribution, are performed typically on the basis of the first subrange and on the basis of the second subrange. The fat content can be determined particularly accurately if, in taking account of the first subrange and of the second subrange, more than 80% of the spectral magnetic resonance data are included and are taken into account in the method according to the invention.

According to an embodiment of the method, a first average value is an average value of the frequency range forming the basis of the first contribution to the spectral magnetic resonance data, a second average value is an average value of a frequency range forming the basis of a water-based contribution to the spectral magnetic resonance data, a further average value is an average value of a frequency range forming the basis of a contribution to the spectral magnetic resonance data based on the further substance, and the difference between the first average value and the further average value is at least three times as great as the difference between the second average value and the further average value.

An average value may be an arithmetic mean and/or a median, for example. The first average value and/or second average value and/or further average value can define a frequency of the frequency range at which frequency the first contribution and/or the second contribution and/or the further substance has the greatest rate of occurrence in the spectral magnetic resonance data. The difference between two average values is preferably the magnitude of the difference between the two average values. According to this embodiment, the further substance, because of its spectral characteristics, has a stronger effect on the water-based contribution than on the fat-based contribution, which means that in particular the second contribution is affected by the further substance. In this case, the further substance typically broadens the frequency range forming the basis of the second contribution. The method according to the invention is particularly advantageous in this case.

The invention also encompasses a magnetic resonance apparatus having a control computer having a determination processor. The determination processor is designed to perform the method according to the invention for determining a fat content of a liver of a patient using measured spectral magnetic resonance data.

For this purpose, the determination processor has an input, a processor circuit and an output. The determination processor is provided with spectral magnetic resonance data and/or possible basic forms of the function via the input. The determination processor is provided with other functions, algorithms or parameters that are needed in the method via the input. The fat content and/or the determined first contribution and/or the approximation of the second contribution and/or other results from an embodiment of the method according to the invention can be provided via the output. The determination processor is designed to perform a subdivision of a frequency range forming the basis of the spectral magnetic resonance data. For this purpose, the determination processor can be connected to a display unit and/or input unit, so that a user of the magnetic resonance apparatus can manually perform and/or monitor and/or correct the subdivision. The determination processor can also be designed to perform at least some of the subdivision in an automated manner and/or to draw on a predetermined first subrange and/or predetermined second subrange for the subdivision. The determination processor can be integrated in the magnetic resonance apparatus. The determination processor can also be installed separately from the magnetic resonance apparatus. The determination processor can be connected to the magnetic resonance apparatus.

In addition, the magnetic resonance apparatus is designed to emit magnetic resonance sequences to an examination subject and to record spectral magnetic resonance data, the acquired spectral magnetic resonance data being provided to the determination processor of the magnetic resonance apparatus according to the invention for the purpose of performing the method according to the invention.

According to an embodiment of the invention, the magnetic resonance apparatus has a whole-body magnetic resonance data acquisition scanner. A whole-body magnetic resonance scanner is designated so that a patient, in particular a human subject under examination, can be examined in its entirety using the whole-body magnetic resonance scanner. In particular, the patient receiving zone of the whole-body magnetic resonance scanner has a diameter and/or circumference that is greater in size than the diameter and/or circumference of an average patient, in particular of a patient who is not obese. A whole-body magnetic resonance device can also be used to produce image data from all extremities and/or organs of the patient.

Embodiments of the magnetic resonance apparatus according to the invention correspond to the embodiments of the method according to the invention. The magnetic resonance apparatus can have additional control components that are needed and/or advantageous for performing the method according to the invention. The magnetic resonance apparatus can also be designed to send control signals and/or to receive and/or to process control signals in order to perform the method according to the invention. The magnetic resonance apparatus is designed to measure spectral magnetic resonance data. The determination processor is preferably part of the control computer of the magnetic resonance apparatus according to the invention. Computer programs and further software, with which the processor circuit of the determination processor automatically controls and/or performs the method according to the invention, can be stored on a memory of the determination processor.

The present invention also encompasses a non-transitory, computer-readable data storage medium encoded with programming instructions that, when the storage medium is loaded into a control computer or computer system of a magnetic resonance apparatus, caused the computer or computer system to operate the magnetic resonance apparatus in order to implement any or all embodiments of the method according to the invention, as described above.

Examples of electronically readable data storage media are a DVD, a magnetic tape or a USB stick, on which is stored electronically readable control information, in particular software.

The advantages of the magnetic resonance apparatus according to the invention and the electronically readable data storage medium according to the invention essentially correspond to the advantages of the method according to the invention for determining a fat content of a liver of a patient using measured spectral magnetic resonance data, which are presented in detail above. Features, advantages or alternative embodiments mentioned in connection with the method are applicable to the other aspects the invention.

BRIEF DESCRIPTION OF THE DRAWINGS

FIG. 2 is a flowchart of a first embodiment of the method according to the invention.

FIG. 3 is a flowchart of a second embodiment of the method according to the invention.

FIG. 4 is a flowchart of a third embodiment of the method according to the invention.

DESCRIPTION OF THE PREFERRED EMBODIMENTS

Figure 1:
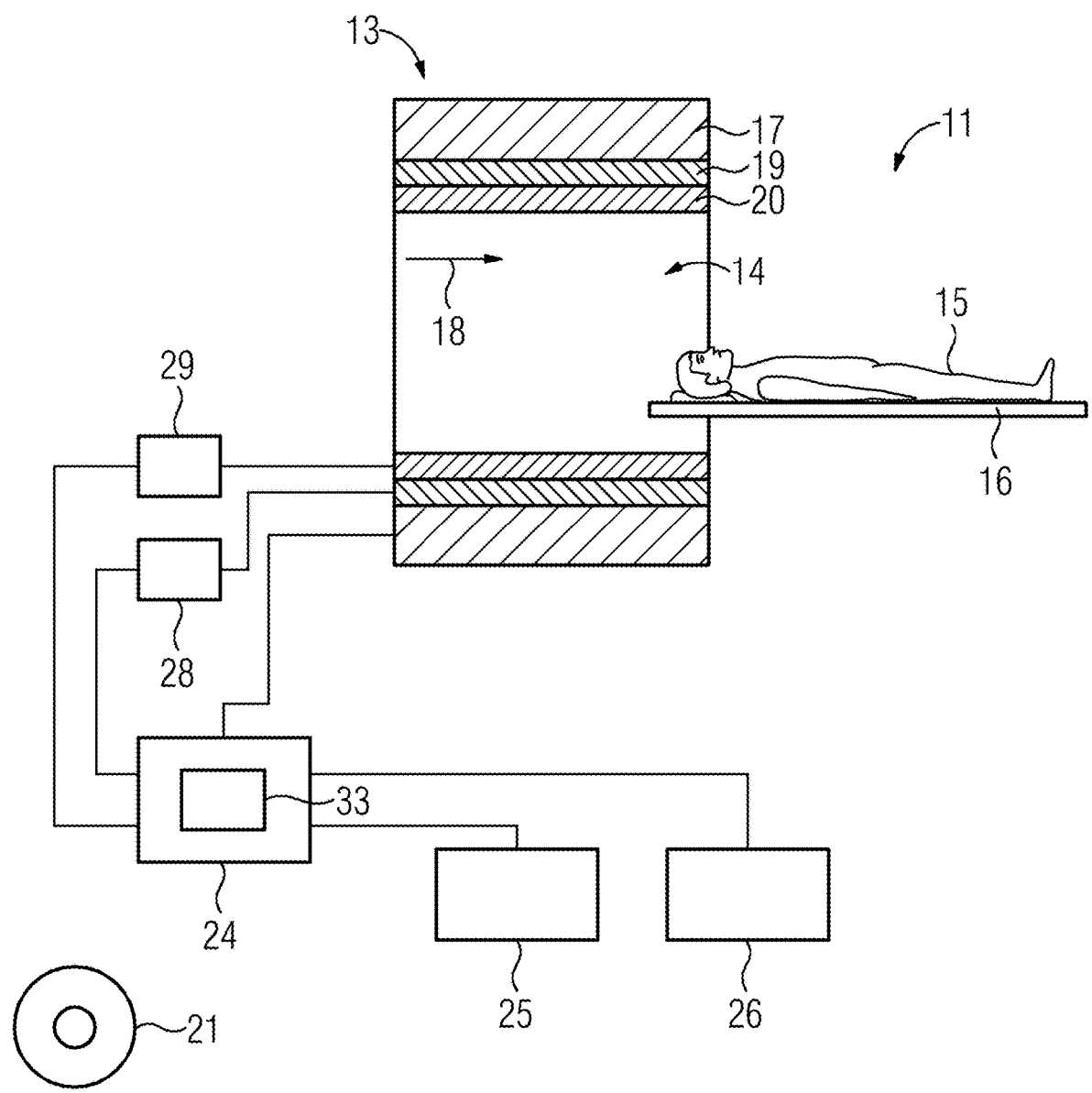
FIG. 1 is a schematic illustration of a magnetic resonance apparatus according to the invention.

FIG. 1 shows a magnetic resonance apparatus 11 according to the invention. The depicted magnetic resonance apparatus 11 shows an embodiment as a whole-body magnetic resonance apparatus. The magnetic resonance apparatus 11 has an MR data acquisition scanner 13 containing a basic field magnet 17 that generates a strong and constant basic magnetic field 18. The scanner 13 has a cylindrical patient receiving zone 14 for receiving a patient 15, the patient receiving zone 14 being cylindrically enclosed circumferentially by the scanner 13. The patient 15 can be moved into the patient receiving zone 14 by a patient support 16 that has a patient bed, which is moveable within the scanner 13.

The scanner 13 further has a gradient coil arrangement 19, which is used for spatially encoding magnetic resonance signals during imaging. The gradient coil arrangement 19 is controlled by a gradient controller 28. The scanner 13 also has an RF antenna 20, which in the case shown is a body coil that is permanently integrated in the scanner 13. An RF antenna controller 29 operates the RF antenna 20 so as to radiate frequency RF pulses into an examination space, which is essentially formed by the patient receiving zone 14.

The radiated RF pulses caused the magnetization of certain nuclear spins in the patient 15 to deviate from the basic magnetic field 18, by an amount known as a flip angle. As these excited nuclear spins relax and return to the steady state, they emit RF signals, called magnetic resonance signals, which are received by the same, or by a different, RF antenna from which the RF pulses were radiated.

The magnetic resonance apparatus 11 comprises a control computer 24 that controls the basic field magnet 17, the gradient controller 28 and the RF antenna controller 29. The control computer 24 centrally controls the magnetic resonance apparatus 11, such as controlling the implementation of magnetic resonance sequences. The control computer 24 has a reconstruction processor (not shown) that reconstructs medical image data from the MR data (raw data) acquired during the magnetic resonance examination. The magnetic resonance apparatus 11 has a display unit 25. Control information such as control parameters, and reconstructed image data, can be displayed to a user via the display unit 25, for example on at least one monitor. In addition, the magnetic resonance apparatus 11 has an input unit 26, via which a user can enter information and/or control parameters during a measurement process. The control computer 24 can include the gradient control unit 28 and/or RF antenna control unit 29 and/or the display unit 25 and/or the input unit 26.

The control unit 24 also has a determination processor 33. The determination processor 33 is designed to perform the method according to the invention for determining a fat content of a liver of a patient using measured spectral magnetic resonance data. For this purpose, the determination processor 33 has computer programs and/or software, which can be loaded directly into a memory (not shown) of the determination processor 33, containing program code in order to perform the inventive method for determining a fat content of a liver of a patient using measured spectral magnetic resonance data, when the computer programs and/or software are executed in the determination processor 33. The determination processor 33 for this purpose has a processor circuit (not shown), which is designed to execute the computer programs and/or software. The computer programs and/or software can be stored on an electronically readable data storage medium 21, which is separate from the control computer 24 and/or determination processor 33. Data access to the electronically readable data storage medium 21 can be made by the determination processor 33 via a data network.

The magnetic resonance apparatus 11 can include further components that are usually present in magnetic resonance apparatuses. Furthermore, since those skilled in the art knows how a magnetic resonance apparatus works in general, a more detailed description is not necessary herein. The magnetic resonance apparatus 11 is thus designed together with the determination processor 33 to perform the method according to the invention.

The method for determining a fat content of a liver of a patient using measured spectral magnetic resonance data can be implemented by an electronically readable data storage medium 21 encoded with electronically readable control information that causes the described method to be performed when the data storage medium 21 is loaded in the determination processor 33 of the magnetic resonance apparatus 11.

FIG. 2 shows a flowchart of a first embodiment of the method according to the invention for determining a fat content of a liver of a patient using measured spectral magnetic resonance data, wherein a first contribution to the spectral magnetic resonance data is based on fat, a second contribution to the spectral magnetic resonance data is based on water and on a further substance. In this embodiment, the measured spectral magnetic resonance data are provided to the computer 24 at the start of the method. The spectral magnetic resonance data may have been recorded by the magnetic resonance apparatus 11 before the start of the method according to the invention.

The method according to the invention starts with method step 100, in which a frequency range 50 that forms the basis of the spectral magnetic resonance data is subdivided at least into a first subrange 51 and into a second subrange 52. This is followed, in method step 110, by an approximation of the second contribution using the spectral magnetic resonance data from the second subrange 52. The approximation of the second contribution can also comprise determining a spread of the second contribution. In the next method step 120, the spectral magnetic resonance data and the approximation of the second contribution are taken into account in determining the first contribution. If in method step 110, a spread of the second contribution was determined, then said spread can also be taken into account in determining the first contribution in method step 120. The method according to the invention ends with method step 130, determining the fat content on the basis of the first contribution.

FIG. 3 shows a flowchart of a second embodiment of a method according to the invention. Analogous to the first embodiment, depicted in FIG. 2, the measured spectral magnetic resonance data is provided at the start of the method, and the embodiment of the method starts with method step 100, subdividing a frequency range 50 that forms the basis of the spectral magnetic resonance data at least into a first subrange 51 and into a second subrange 52.

The approximation of the second contribution using the spectral magnetic resonance data from the second subrange 52 in method step 110, in this embodiment comprises method step 111, fitting a function 62 to an envelope 63 of the spectral magnetic resonance data within the second subrange 52. According to this embodiment, determining the first contribution in method step 120 comprises further method steps 121, 122, 123, in which the spectral magnetic resonance data and the approximation of the second contribution are taken into account: In method step 121, the function 62 fitted in method step 111 is extended into at least part of the first subrange 51. In the next method step 122, a difference between an envelope 63 of the spectral magnetic resonance data and the fitted function 62 extended in method step 121 is formed before the first contribution is determined, in method step 123, by integrating the difference in at least the first subrange 51.

The concluding method step 130, determining the fat content, comprises further method steps 131, 132. In method step 131 here, the integrated data is determined by integrating the extended fitted function 62 and/or by integrating the envelopes 63 of the spectral magnetic resonance data. In method step 132, a quotient is formed from the first contribution and the integrated data in order to determine the fat content.

FIG. 4 shows a flowchart of a third embodiment of a method according to the invention. The method steps 100, 110, 111, 120, 121, 122, 123 are performed in the same way as for the second embodiment, depicted in FIG. 3. The third embodiment of the method according to the invention differs from the second embodiment of the method according to the invention in particular in method step 130, determining the fat content. Here, method step 130 comprises the method steps 133, 134, 135. First, in method step 133, the second contribution is determined by integrating the fitted function 62 extended in method step 121. In method step 134, extrapolation of the first contribution and extrapolation of the second contribution is performed in respect of an acquisition parameter before forming, in method step 135, a quotient from the extrapolated first contribution and the extrapolated second contribution, thereby determining the fat content.

Figure 5:
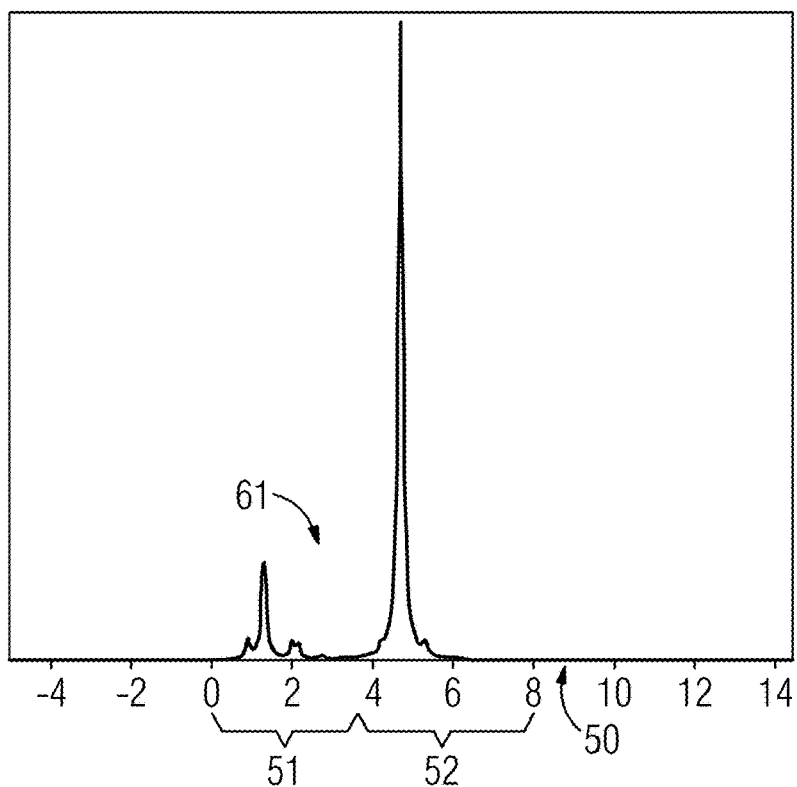
FIG. 5 shows a distribution of spectral magnetic resonance data in the absence of a further substance.

FIG. 5 shows a distribution of spectral magnetic resonance data 61 on the basis of fat and water in the absence of a further substance as a function of the frequency range 50 forming the basis of the spectral magnetic resonance data. The amplitude of the distribution of the spectral magnetic resonance data 61 is given here in arbitrary units. The frequency range 50 is represented, as is typical practice, in ppm from the Larmor frequency, which is defined by the strength of the basic magnetic field of the magnetic resonance device. A further substance contributes at least not significantly to the spectral magnetic resonance data shown in FIG. 5. The frequency range 50 is subdivided into a first subrange 51 and into a second subrange 52. The first subrange 51 is selected such that more than 80% of the first contribution to the spectral magnetic resonance data, which contribution is based on fat, lies within the first subrange 51. The second subrange 52 is selected such that more than 80% of a water-based contribution to the spectral magnetic resonance data lies within the second subrange 52.

The method according to the invention is not typically applied when a distribution of spectral magnetic resonance data 61 of this type exists. In the event that the method according to the invention is applied when such a distribution of spectral magnetic resonance data 61 exists, and a spread of the second contribution is determined as part of the approximation of the second contribution, then the spread of the distribution of spectral magnetic resonance data 61 typically does not reach a predetermined threshold value for the spread, and therefore the first contribution can be determined, for example, by integrating an envelope 63 of the spectral magnetic resonance data within the first subrange 51.

Figure 6:
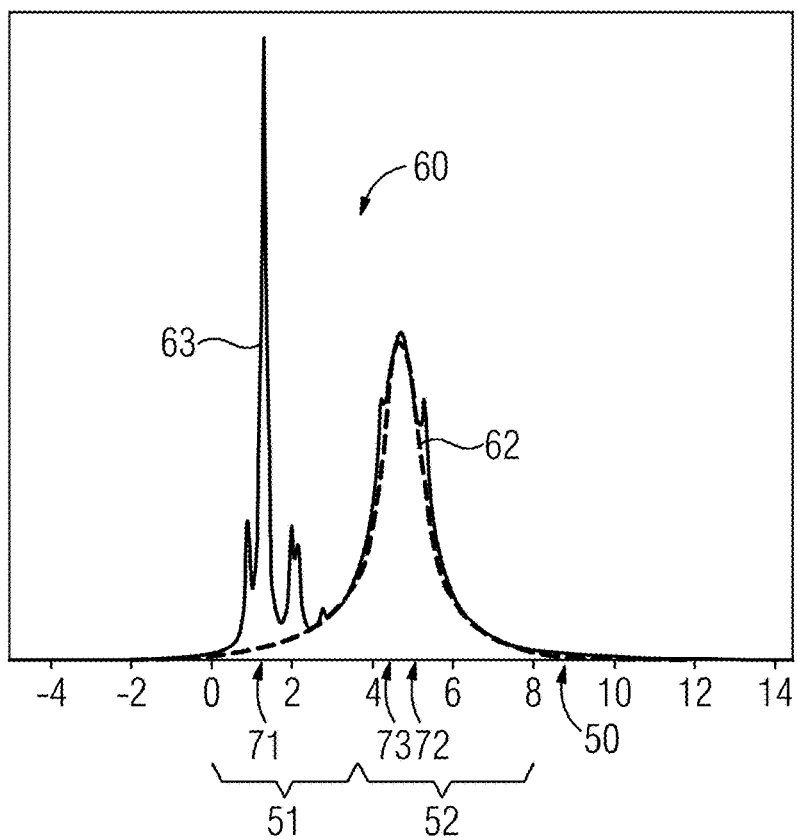
FIG. 6 shows a distribution of spectral magnetic resonance data.

FIG. 6 shows a distribution of spectral magnetic resonance data 60 having a first contribution to the spectral magnetic resonance data on the basis of fat, and a second contribution to the spectral magnetic resonance data on the basis of water and a further substance as a function of the frequency range 50 forming the basis of the spectral magnetic resonance data. The frequency range 50 is subdivided into a first subrange 51 and into a second subrange 52. The first subrange 51 is selected such that more than 80% of the first contribution to the spectral magnetic resonance data, which contribution is based on fat, lies within the first subrange 51. The subdivision of the frequency range 50 into the at least two subranges 51, 52 is made here such that more than 80% of the spectral magnetic resonance data lies within the two subranges 51, 52.

The first average value 71 is an average value of the frequency range forming the basis of the first contribution to the spectral magnetic resonance data. The second average value 72 is an average value of a frequency range forming the basis of a water-based contribution to the spectral magnetic resonance data. The further average value 73 is an average value of a frequency range forming the basis of a contribution to the spectral magnetic resonance data based on the further substance. The difference between the first average value 71 and the further average value 73 is at least three times as great as the difference between the second average value 72 and the further average value 73.

FIG. 6 also shows a function 62 fitted to an envelope 63 of the spectral magnetic resonance data within the second subrange 52, which fitting is performed in method step 111 for the approximation of the second contribution. The fitted function 62 is extended to the portions of the frequency range 50 that surround the second subrange 52, including also the first subrange 51.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for determining a fat content of the liver of a patient using measured spectral magnetic resonance (MR) data, said method comprising:
   providing a computer with spectral MR data acquired from the liver of a patient, said spectral MR data having an associated frequency range comprising a first contribution to the spectral MR data based on fat, and a second contribution to the spectral MR data based on water and a further substance;
   in said computer, subdividing the frequency range of the spectral MR data into at least a distribution of the spectral MR data corresponding to a first subrange and a distribution of the spectral MR data corresponding to a second subrange;
   in said computer, approximating the second contribution using the spectral MR data from the second subrange;
   in said computer, determining the first contribution dependent on the spectral MR data and the approximation of the second contribution;
   in said computer, determining the fat content of the liver of the patient from said first contribution; and
   in said computer, generating an electronic signal representing said fat content and making said electronic signal available as an output from the computer.

2. A method as claimed in claim 1 comprising, in said computer:
   approximating said second contribution by determining a spread of said second contribution; and
   determining said first contribution dependent on the determined spread of said second contribution.

3. A method as claimed in claim 1 comprising approximating said second contribution by fitting a function to an envelope of the spectral MR data within said second subrange.

4. A method as claimed in claim 2 comprising, determining said first contribution by, in said computer:
   extending the fitted function into at least a part of the first subrange;
   finding a difference between the envelope of the spectral MR data and the extended fitted function; and
   determining the first contribution by integrating said difference at least in said first subrange.

5. A method as claimed in claim 4 comprising, determining the fat content by, in said computer:
   determining integrated data by at least one of the integrating the extended fitted function or by integrating the envelope of the spectral MR data; and
   forming a quotient from said first contribution and said integrated data.

6. A method as claimed in claim 3 comprising determining said fat content by, in said computer:
   determining the second contribution by integrating the extended fitted function;
   extrapolating the first contribution and extrapolating the second contribution dependent on an acquisition parameter used to acquire said spectral MR data; and
   performing a quotient from the extrapolated first contribution and the extrapolated second contribution.

7. A method as claimed in claim 1 comprising said dividing said frequency range of said spectral MR data such that more than 80% of said first contribution lies within said first subrange.

8. A method as claimed in claim 1 comprising said dividing said frequency range of said spectral MR data such that more than 80% of a water-based contribution to the spectral MR data lies within said second subrange.

9. A method as claimed in claim 1 comprising subdividing said frequency range of said spectral MR data such that more than 80% of the spectral MR data lies within said first and second subranges.

10. A method as claimed in claim 1 comprising, in said computer:
    determining a first average value of said first contribution to the spectral MR data in said frequency range;
    determining a second average value of said water-based contribution to the spectral MR data in said frequency range;
    determining a further average value of a contribution to the spectral MR data by said further substance in said frequency range; and
    a difference between said first average value and said further average value being at least three times as large as a difference between said second average value and said further average value.

11. A magnetic resonance (MR) apparatus comprising:
    an MR data acquisition scanner;
    a computer configured to operate the MR data acquisition scanner in order to acquire spectral MR data from the liver of a patient, said spectral MR data having an associated frequency range and comprising a first contribution to the spectral MR data based on fat, and a second contribution to the spectral MR data based on water and a further substance;

said computer being configured to subdivide the frequency range of the spectral MR data into at least a distribution of the spectral MR data corresponding to a first subrange and a distribution of the spectral MR data corresponding to a second subrange;

said computer being configured to approximate the second contribution using the spectral MR data from the second subrange;

said computer being configured to determine the first contribution dependent on the spectral MR data and the approximation of the second contribution;

said computer being configured to determine the fat content of the liver of the patient from said first contribution; and said computer being configured to generate an electronic signal representing said fat content and to make said electronic signal available as an output from the computer.

12. A non-transitory, computer-readable data storage medium encoded with programming instructions, said storage medium being loaded into a computer system having magnetic resonance (MR) apparatus, and said programming instructions causing said computer system to:

receive spectral MR data acquired from the liver of a patient, said spectral MR data having an associated frequency range and comprising a first contribution to the spectral MR data based on fat, and a second contribution to the spectral MR data based on water and a further substance;

subdivide the frequency range of the spectral MR data into at least a distribution of the spectral MR data corresponding to a first subrange and a distribution of the spectral MR data corresponding to a second subrange;

approximate the second contribution using the spectral MR data from the second subrange;

determine the first contribution dependent on the spectral MR data and the approximation of the second contribution;

determine the fat content of the liver of the patient from said first contribution; and generate an electronic signal representing said fat content and make said electronic signal available as an output from the computer.

13. A method of claim 1, wherein the act of determining the fat content of the liver of the patient is performed irrespective of the presence of the further substance.

14. A method of claim 13, wherein the act of determining the fat content of the liver of the patient is performed irrespective of the concentration of the further substance.

15. A method as claimed in claim 1, wherein the frequency range of the spectral MR data includes a range of frequencies associated with a distribution of corresponding magnetic resonance signals that are recorded to acquire magnetic resonance data to image the liver of the patient.

16. A method as claimed in claim 2, further comprising:
fitting a function to an envelope of the spectral MR data within the second subrange; and
determining a standard deviation of the fitted function,
wherein the act of determining the spread of said second contribution includes determining the spread of said second contribution using the standard deviation of the fitted function.

17. A method as claimed in claim 1, wherein the act of subdividing the frequency range of the spectral MR data into at least the first subrange and the second subrange is performed without consideration of the further substance.

18. A method as claimed in claim 1, wherein the act of subdividing the frequency range of the spectral MR data into at least the first subrange and the second subrange is performed such that the first subrange is selected having a maximum frequency difference from the Larmor frequency of 5 ppm.

* * * * *